(12) United States Patent
Sadate et al.

(10) Patent No.: US 7,940,505 B1
(45) Date of Patent: May 10, 2011

(54) LOW POWER LOAD SWITCH WITH PROTECTION CIRCUITRY

(75) Inventors: Aline C. Sadate, Allen, TX (US); Christopher T. Maxwell, Sherman, TX (US); Nakshatra S. Gajbhiye, Plano, TX (US); Mustapha El-Markhi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 6 days.

(21) Appl. No.: 12/628,880

(22) Filed: Dec. 1, 2009

(51) Int. Cl.
*H02H 5/04* (2006.01)
*H02H 3/08* (2006.01)
*H02H 9/02* (2006.01)
*H02H 3/00* (2006.01)
*H02H 9/08* (2006.01)

(52) U.S. Cl. .............. 361/93.8; 361/78; 361/79; 361/87; 361/93.1; 361/93.9; 361/103

(58) Field of Classification Search ................... 361/93.8
See application file for complete search history.

(56) References Cited

U.S. PATENT DOCUMENTS

| 5,550,701 | A | | 8/1996 | Nadd et al. |
| 5,761,020 | A | * | 6/1998 | Nadd ............................ 361/103 |
| 6,347,028 | B1 | * | 2/2002 | Hausman et al. ............ 361/93.1 |
| 6,865,063 | B2 | | 3/2005 | Ball |
| 7,099,135 | B2 | * | 8/2006 | Ball et al. ..................... 361/93.9 |
| 7,532,448 | B2 | | 5/2009 | So |

OTHER PUBLICATIONS

"FPF2024/5/6/7 Full Functional Load Switch With 100mA Current Limit," Sep. 2008, pp. 1-17.
"Low-Input-Voltage Current-Limited Load Switches With Shut Off and Auto-Restart Feature," Nov. 2009, pp. 1-19.

* cited by examiner

*Primary Examiner* — Dharti H Patel
(74) *Attorney, Agent, or Firm* — John J. Patti; Wade J. Brady, III; Frederick J. Telecky, Jr.

(57) ABSTRACT

Load switches are relatively common and in use with a variety of applications, and conventional load switches have been designed to have continually operating protection circuitry, which can consume a great deal of power. Here, a load switch integrated circuit (IC) is provided where a controller within the IC activates and deactivates various protection circuits in a sequence, allowing the protection circuit to protect the IC while also reducing power consumption.

19 Claims, 2 Drawing Sheets

LOW POWER LOAD SWITCH WITH PROTECTION CIRCUITRY

TECHNICAL FIELD

The invention relates generally to an integrated circuit (IC) and, more particularly, to a load switch with protection circuitry.

BACKGROUND

Load switches are relatively common and in use with a variety of applications. However, load switches, like other ICs, have limitations and generally employ protection circuitry to prevent failure under certain conditions, like excessive temperature or current. To date, though, load switches have been designed to have continually operating protection circuitry, which can consume a great deal of power. With an increased desire for lower power operation and lower power consumption, these conventional load switches simply do not satisfy these desires. Therefore, there is a need for a low power load switch with protection circuitry.

Some examples of conventional circuit are: U.S. Pat. No. 5,550,701; U.S. Pat. No. 5,761,020; U.S. Pat. No. 6,865,063; U.S. Pat. No. 7,532,448; the FPF2025/6/7 (datasheet) by Fairchild Semiconductor International, Inc.; and the TPS22945 (datasheet) by Texas Instruments Incorporated.

SUMMARY

A preferred embodiment of the present invention, accordingly, provides an apparatus. The apparatus comprises an input terminal; an output terminal; a transistor having a first passive electrode, a second passive electrode, and a control electrode, wherein the first passive electrode is coupled to the input terminal, and wherein the second passive electrode is coupled to the output terminal; a driver that is coupled to the control electrode of the transistor; an over-temperature circuit that determines whether at least a portion of the apparatus is greater than a predetermined temperature when activated; an over-current circuit that determines whether a current through the transistor is greater than a predetermined current when activated; a short-circuit detector that determines whether a short-circuit condition is present when activated; and a controller that is coupled to the driver, the over-current circuit, the over-temperature circuit, and the short-circuit detector, wherein the controller activates the over-current circuit at a first predetermined interval, the over-temperature circuit at a second predetermined interval, and the short-circuit detector at a third predetermined interval, wherein the length of the first interval is greater than the length of the second predetermined interval, and wherein the length of the second predetermined interval is greater than the length of the third predetermined interval.

In accordance with a preferred embodiment of the present invention, the apparatus further comprises an oscillator that is coupled to the controller.

In accordance with a preferred embodiment of the present invention, the over-current circuit is coupled to the driver.

In accordance with a preferred embodiment of the present invention, the apparatus further comprises: an over-current terminal; a ground terminal; and a second transistor having a first passive electrode, a second passive electrode, and a control electrode, wherein the first passive electrode of the second transistor is coupled to the over-current terminal, and wherein the second passive electrode is coupled to the ground terminal, and wherein the control electrode is coupled to the controller.

In accordance with a preferred embodiment of the present invention, the transistor further comprises an NMOS transistor.

In accordance with a preferred embodiment of the present invention, the first interval is about 63.5 ms.

In accordance with a preferred embodiment of the present invention, the second interval is about 7.5 ms.

In accordance with a preferred embodiment of the present invention, the third interval is about 250 µs.

In accordance with a preferred embodiment of the present invention, an apparatus is provided. The apparatus comprises an input terminal; an output terminal; a MOS transistor that is coupled to the input terminal at its source and to the output terminal at its drain; an oscillator that generates a clock signal; a controller that is coupled to oscillator and that generates a first timing signal, a second timing signal, a third timing signal, and an actuation signal, wherein a first time between consecutive pulses of the first signal is greater than a second time between consecutive between consecutive pulses of the second timing signal, and wherein the second time is greater than a third time between consecutive pulses of the third timing signal; a driver that is coupled to the gate of the MOS transistor and to the controller, wherein the driver receives the actuation signal from the controller so as to actuate and deactivate the MOS transistor; an over-current circuit that determines whether a current through the transistor is greater than a predetermined current when activated, wherein the over-current is coupled to the controller so as to receive the first timing signal; an over-temperature circuit that determines whether at least a portion of the apparatus is greater than a predetermined temperature when activated, wherein the over-temperature circuit is coupled to the controller so as to receive the second timing signal; and a short-circuit detector that determines whether a short-circuit condition is present when activated, wherein the short-circuit detector is coupled to the controller so as to receive the third timing signal.

In accordance with a preferred embodiment of the present invention, the over-current circuit is coupled to the driver.

In accordance with a preferred embodiment of the present invention, the apparatus further comprises: an over-current terminal; a ground terminal; and a second MOS transistor is coupled to the over-current terminal at its source, the ground terminal at its drain, and the controller at its gate.

In accordance with a preferred embodiment of the present invention, the second MOS transistor is an NMOS transistor.

In accordance with a preferred embodiment of the present invention, the method comprises entering into an over-current mode at a first interval; measuring a current through a transistor within the load switch to determine whether the current is greater than a predetermined current while in the over-current mode; entering into an over-temperature mode at a second interval, wherein the second interval is less than the first predetermined interval, and wherein at least one second interval occurs within one first interval; measuring a temperature of the load switch to determine whether the temperature is greater than a predetermined temperature while in the over-temperature mode; alternating between a low-power mode and a short-circuit mode within the second interval; and determining whether a short-circuit condition is present during the short-circuit mode.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
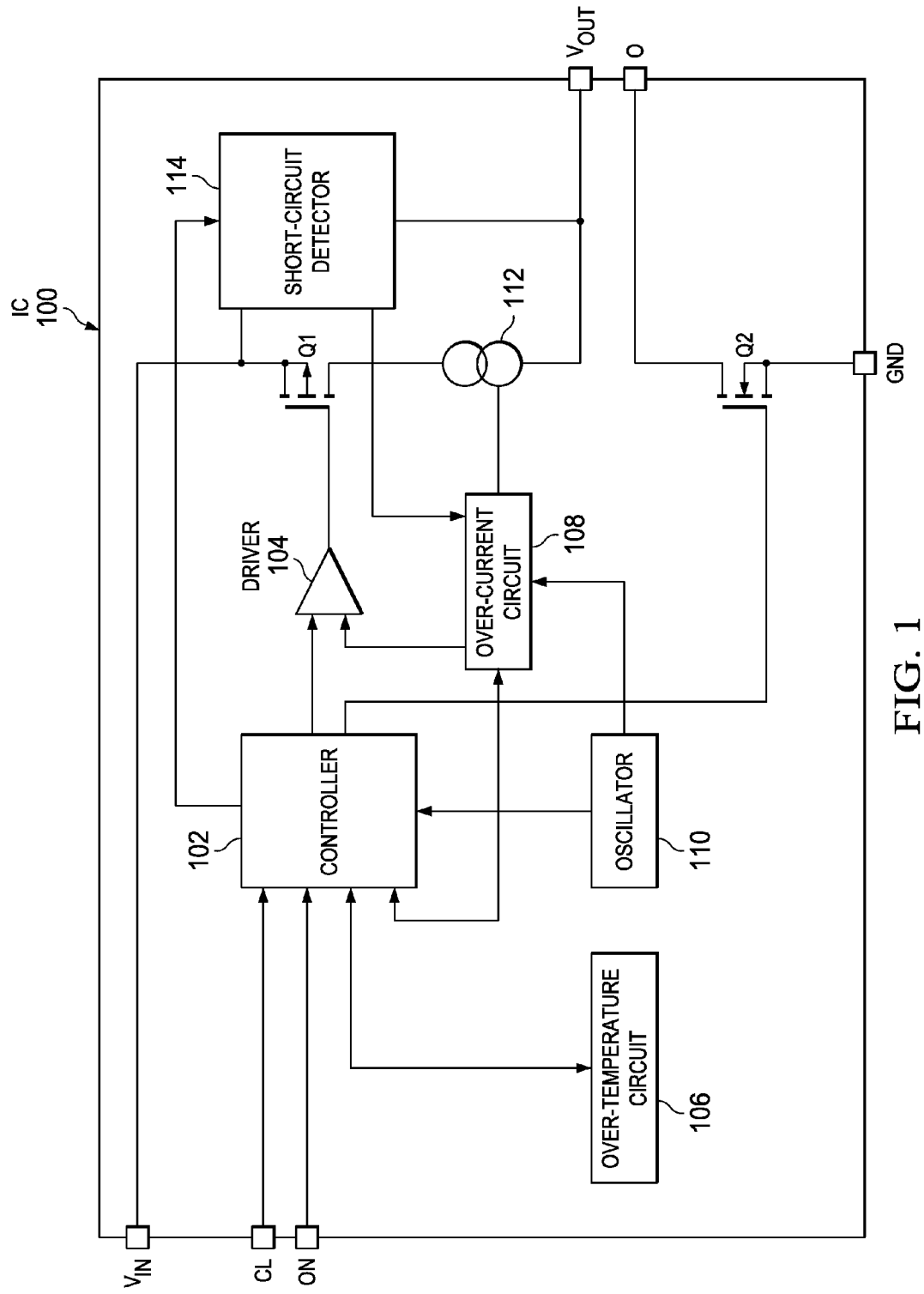
FIG. 1 is an example of an integrated circuit (IC) in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates an integrated circuit (IC) in accordance with a preferred embodiment of the present invention. IC 100 generally comprises transistors Q1 and Q2 (which are preferably NMOS transistors), a controller 102, a driver 104, over-temperature circuit 106, over-current circuit 108, oscillator 110, current source 112, short-circuit detector 114, input terminal VIN, output terminal VOUT, control terminal CL, activation terminal ON, ground terminal GND, and over-current terminal O.

In operation, IC 100 operates as a "load switch," controlling whether current can flow from the input terminal VIN to the output terminal VOUT. An example of a conventional load switch IC is the TPS22945 by Texas Instruments Incorporated. IC 100 is generally controlled by controller 102, which is able to be activated through activation terminal ON and controlled through control terminal CL. IC 100, as with any other semiconductors, though, operates under certain specified conditions, such as a predetermined temperature range; if IC 100 is operated outside the specified conditions, then failure of IC 100 can occur. In order to help ensure that the IC 100 does not operate outside of these specified conditions, protection circuitry is employed, namely over-current, over-temperature, and short-circuit protection.

Figure 2:
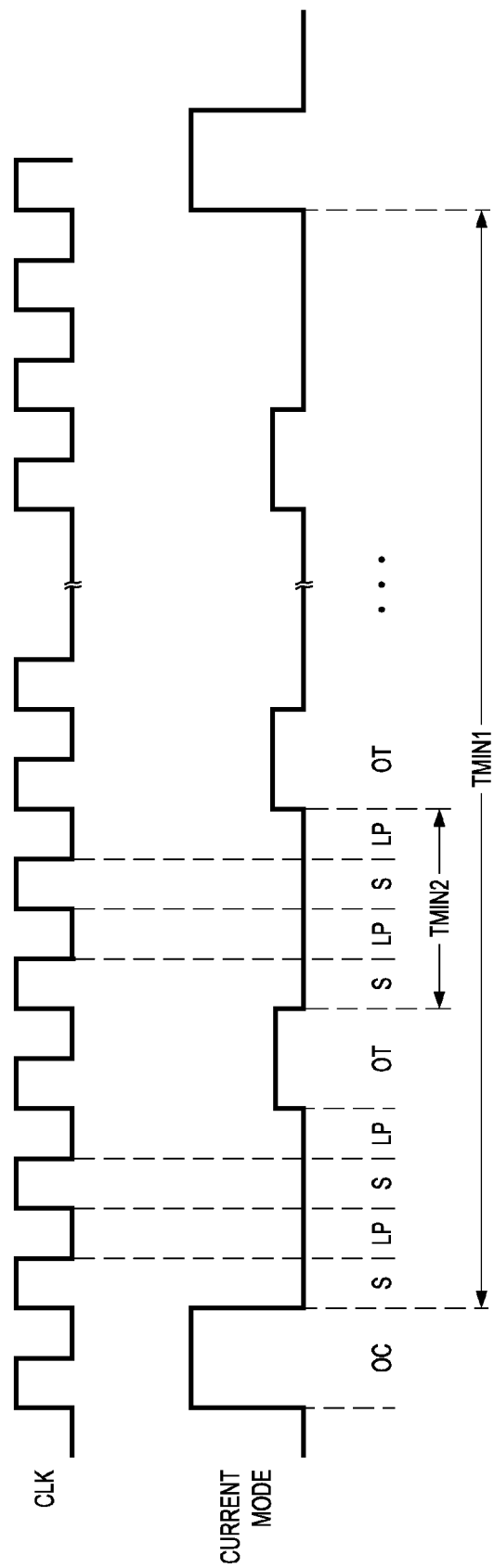
FIG. 2 is a timing diagram for the operation of the IC of FIG. 1.

Turning first to the over-current circuit 108, it determines whether the current through transistor Q1 has exceeded a predetermined current. Generally, IC 100 can carry a current of about 200 mA (within about 3 μA). When activated, the over-current circuit 108 receives a clock signal CLK (as shown in FIG. 2) from the oscillator 110 and employs current source 112 to measure the current through transistor Q1. If an over-current condition is detected (i.e., the current through transistor Q1 exceeds the predetermined current), the over-current circuit 108 first limits the current through transistor Q1, then provides an over-current signal to the controller 102, which actuates (or deactivates, as desired) transistor Q2 to coupled (or decouple) the over-current terminal O and the ground terminal GND.

The controller 102 can also activate the over-temperature circuit 106 and short-circuit detector 114 to make other measurements. The over-temperature circuit 106, which, for example, can be comprised of a diode and current comparator, measures whether the IC 100 has exceeded a predetermined temperature, and, if the temperature of the IC 100 is greater than the predetermined temperature (such as 140 C), the over-temperature circuit 106 can provide an over-temperature signal to controller 102 to "shut down" the IC 100. The short-circuit detector 114, which can be, for example, a comparator, can determine whether a short-circuit conditions is present. Effectively, the short-current condition is an over-current condition, so the short-circuit detector 114 can provide a short-circuit signal to the over-current circuit 108 so that it may provide an over-current signal to the controller 102.

Ideally, each protection circuit would continuously operate, but continuous operation can dramatically increase power consumption, so the controller 102 activates each of the protection circuits in sequence to both protect the IC 100 and to reduce power consumption, compared to conventional load switches. To do this, controller 102 provides timing signals to each of the over-current circuit 108, the over-temperature circuit 106, and the short-circuit detector 114, which are generated from the clock signal CLK (as shown in FIG. 2) from oscillator 110. The clock signal CLK generally has a period or cycle time of, for example, about 500 μs. As shown in FIG. 2, the largest relative current draw occurs in over-current mode OC (which lasts, for example, about 1 clock cycle or about 500 μs) when the over-current circuit 108 is operating, so the controller 102 limits consecutive activations of the over-current circuit 108 to a period TMIN1. Period TNIM1 is preferably about 63.5 ms, but can be chosen based on the specifics of the IC 100. Between consecutive activations of the over-current circuit 108 or consecutive pulses of its timing signal, the controller 102 can actuate over-temperature circuit 106 multiple times in an over-temperature mode OT (which lasts, for example, about 1 clock cycle or about 500 μs) at an interval TMIN2, where the time between consecutive activations or time between consecutive pulses, for example, can be about 7.5 ms. The remainder of the time, the controller 102 alternates between a short-circuit mode S, where the short-circuit detector 114 is activated, and a low-power mode LP, where all of the protection circuits are deactivated. Each of the short-circuit mode S and low-power mode LP have an operating interval of, for example, about 1 clock cycle or about 250 μs. Operating in this manner, IC 100 is able to remain protected while reducing power consumption compared to other convention ICs.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:
1. An apparatus comprising:
   an input terminal;
   an output terminal;
   a transistor having a first passive electrode, a second passive electrode, and a control electrode, wherein the first passive electrode is coupled to the input terminal, and wherein the second passive electrode is coupled to the output terminal;

a driver that is coupled to the control electrode of the transistor;

an over-temperature circuit that determines whether at least a portion of the apparatus is greater than a predetermined temperature when activated;

an over-current circuit that determines whether a current through the transistor is greater than a predetermined current when activated;

a short-circuit detector that determines whether a short-circuit condition is present when activated; and a controller that is coupled to the driver, the over-current circuit, the over-temperature circuit, and the short-circuit detector, wherein the controller activates the over-current circuit at a first predetermined interval, the over-temperature circuit at a second predetermined interval, and the short-circuit detector at a third predetermined interval, wherein the length of the first interval is greater than the length of the second predetermined interval, and wherein the length of the second predetermined interval is greater than the length of the third predetermined interval.

2. The apparatus of claim 1, wherein the apparatus further comprises an oscillator that is coupled to the controller.

3. The apparatus of claim 1, wherein the over-current circuit is coupled to the driver.

4. The apparatus of claim 1, wherein the apparatus further comprises:

an over-current terminal;

a ground terminal; and a second transistor having a first passive electrode, a second passive electrode, and a control electrode, wherein the first passive electrode of the second transistor is coupled to the over-current terminal, and wherein the second passive electrode is coupled to the ground terminal, and wherein the control electrode is coupled to the controller.

5. The apparatus of claim 1, wherein the transistor further comprises an NMOS transistor.

6. The apparatus of claim 1, wherein the first interval is about 63.5 ms.

7. The apparatus of claim 6, wherein the second interval is about 7.5 ms.

8. The apparatus of claim 7, wherein the third interval is about 250 μs.

9. An apparatus comprising:

an input terminal;

an output terminal;

a MOS transistor that is coupled to the input terminal at its source and to the output terminal at its drain;

an oscillator that generates a clock signal;

a controller that is coupled to the oscillator and that generates a first timing signal, a second timing signal, a third timing signal, and an actuation signal, wherein a first time between consecutive pulses of the first signal is greater than a second time between consecutive between consecutive pulses of the second timing signal, and wherein the second time is greater than a third time between consecutive pulses of the third timing signal;

a driver that is coupled to the gate of the MOS transistor and to the controller, wherein the driver receives the actuation signal from the controller so as to actuate and deactivate the MOS transistor;

an over-current circuit that determines whether a current through the transistor is greater than a predetermined current when activated, wherein the over-current circuit is coupled to the controller so as to receive the first timing signal;

an over-temperature circuit that determines whether at least a portion of the apparatus is greater than a predetermined temperature when activated, wherein the over-temperature circuit is coupled to the controller so as to receive the second timing signal; and a short-circuit detector that determines whether a short-circuit condition is present when activated, wherein the short-circuit detector is coupled to the controller so as to receive the third timing signal.

10. The apparatus of claim 9, wherein the over-current circuit is coupled to the driver.

11. The apparatus of claim 9, wherein the apparatus further comprises:

an over-current terminal;

a ground terminal; and a second MOS transistor is coupled to the over-current terminal at its source, the ground terminal at its drain, and the controller at its gate.

12. The apparatus of claim 11, wherein the second MOS transistor is an NMOS transistor.

13. The apparatus of claim 9, wherein the transistor further comprises an NMOS transistor.

14. The apparatus of claim 9, wherein the first time is about 63.5 ms.

15. The apparatus of claim 14, wherein the second time is about 7.5 ms.

16. The apparatus of claim 15, wherein the third time is about 250 μs.

17. The method of claim 14, wherein the first interval is about 63.5 ms.

18. The method of claim 14, wherein the second interval is about 7.5 ms.

19. A method for operating a load switch, the method comprising:

entering into an over-current mode at a first interval;

measuring a current through a transistor within the load switch to determine whether the current is greater than a predetermined current while in the over-current mode;

entering into an over-temperature mode at a second interval, wherein the second interval is less than the first predetermined interval, and wherein at least one second interval occurs within one first interval;

measuring a temperature of the load switch to determine whether the temperature is greater than a predetermined temperature while in the over-temperature mode;

alternating between a low-power mode and a short-circuit mode within the second interval; and determining whether a short-circuit condition is present during the short-circuit mode.

* * * * *